(12) United States Patent
Mayer et al.

(10) Patent No.: US 6,333,275 B1
(45) Date of Patent: Dec. 25, 2001

(54) ETCHANT MIXING SYSTEM FOR EDGE BEVEL REMOVAL OF COPPER FROM SILICON WAFERS

(75) Inventors: Steven T. Mayer, Lake Oswego; John B. Alexy, West Linn; Jinbin Feng, Tigard, all of OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/557,695

(22) Filed: Apr. 25, 2000

Related U.S. Application Data
(60) Provisional application No. 60/157,254, filed on Oct. 1, 1999.

(51) Int. Cl.[7] .............................. H01L 21/00; C23F 1/00
(52) U.S. Cl. ..................... 438/745; 156/345; 216/86; 216/92; 216/105; 438/8; 438/747; 438/748
(58) Field of Search ........................ 156/345 L, 345 LC, 156/345 LS; 216/84, 86, 91, 92, 100, 105; 252/79.2; 438/8, 745, 747, 748, 954

(56) References Cited

U.S. PATENT DOCUMENTS
5,486,234   1/1996   Contolini et al. .
5,674,410 * 10/1997   Nakajima et al. ..................... 216/92

* cited by examiner

*Primary Examiner*—William A. Powell
(74) *Attorney, Agent, or Firm*—Beyer Weaver & Thomas, LLP

(57) ABSTRACT

A chemical etching system provides a mixture of sulfuric acid and hydrogen peroxide and serves as the etchant for removing residual copper from an edge bevel region of a semiconductor wafer. The etching system includes a dilution module where concentrated sulfuric acid and concentrated hydrogen peroxide are diluted to the appropriate concentrations and then stored. To reduce the likelihood that oxygen bubbles (from hydrogen peroxide decomposition) will appear in the etchant solution, stored sulfuric acid and hydrogen peroxide are mixed immediately prior to use. In this manner, the dissolved oxygen concentration in the hydrogen peroxide decreases well below the saturation level.

24 Claims, 11 Drawing Sheets

ETCHANT MIXING SYSTEM FOR EDGE BEVEL REMOVAL OF COPPER FROM SILICON WAFERS

CROSS-REFERENCE TO RELATED APPLICATIONS

This application claims priority under 35 U.S.C. §119(e) from co-pending U.S. Provisional Patent Application No. 60/157,254, filed Oct. 1, 1999, naming S. Mayer et al. as inventors, and titled "METHOD, MATERIALS AND APPARATUS FOR EDGE BEVEL REMOVAL OF COPPER FROM SILICON WAFERS." This application is also related to U.S. patent application Ser. No. 09/557,668 filed on the same day as the instant application, naming Mayer et al. as inventors, and titled "EDGE BEVEL REMOVAL OF COPPER FROM SILICON WAFERS" and U.S. patent application Ser. No. 09/558,249 filed on the same day as the instant application, naming Mayer et al. as inventors, and titled "WAFER CHUCK FOR USE IN EDGE BEVEL REMOVAL OF COPPER FROM SILICON WAFERS." The provisional patent application as well as the regular U.S. applications referenced above are hereby incorporated by reference in their entireties and for all purposes.

BACKGROUND OF THE INVENTION

This invention relates to technology for removing unwanted metal from semiconductor wafers. More particularly, it pertains to chemical dilution modules for preparing etchant chemicals for use in etching away the unwanted metal.

Damascene processing is a method for forming metal lines on integrated circuits. It is often a preferred method because it requires fewer processing steps than other methods and offers a higher yield. In Damascene processing, as well as other integrated circuit manufacturing processes, the conductive routes on the surface of the circuit are generally formed out of a common metal, traditionally aluminum. Copper is a favored metal because of its higher conductivity and electromigration resistance when compared to aluminum, but copper presents special challenges because it readily diffuses into silicon oxide and reduces its electrical resistance at very low doping levels.

During integrated circuit fabrication, conductive metal is needed on the active circuit region of the wafer, i.e., the main interior region on the front side, but is undesirable elsewhere. In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside. Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in pending U.S. patent application Ser. No. 08/969,984, "CLAMSHELL APPARATUS FOR ELECTROCHEMICALLY TREATING SEMICONDUCTOR WAFERS" naming E. Patton et al. as inventors, and filed Nov. 13, 1997, which is herein incorporated by reference in its entirety.

The PVD metal remaining on the wafer edge after electrofill is undesirable for various reasons. One reason is that PVD metal layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick, even electrofill metal and planarized by CMP down to the dielectric. This flat surface, which is mostly dielectric, is then covered with a barrier layer substance such as SiN that both adheres well to the dielectric and aids in the adhesion of subsequent layers. Another reason to remove the residual PVD metal layers in the wafer edge area is that the barrier layers underneath them are also thin and uneven, which may allow migration of the metal into the dielectric. This problem is especially important when the metal is copper.

To address these problems, semiconductor equipment may have to allow etching of the unwanted residual metal layers. Various difficulties will be encountered in designing a suitable etching system.

Depending upon the type of metal to be removed and the characteristics of the etching system, some liquid etchant compositions are appropriate and others are not. In general, the liquid etchant should etch the unwanted metal rapidly at room temperature. But, it should not aggressively attack the mechanical and electrical components of the etch system. In addition, it should not liberate dangerous, gaseous by-products during the etching reaction. For example, nitric acid should be avoided because it liberates nitric oxide during reaction with copper. Still further, the components of the liquid etchant should include only those materials readily available in normal integrated circuit manufacturing facilities. Other beneficial properties of a liquid etchant include a long shelf life (preferably without stabilizers) and a consistent etching rate over time.

The liquid etchant should have physical properties compatible with the etching system. The viscosity and density should allow delivery onto the semiconductor wafer in a desired flow regime (e.g., a viscous flow regime). In addition, the liquid etchant must flow in a continuous stream without abrupt interruptions caused by bubbles and the like. Such discontinuities cause inconsistent application of the etchant on the wafer and lead to inconsistent chemical etching. For example, bubbles in the liquid etchant can generate a scallop pattern on the semiconductor wafer. They may also cause the etchant to spray onto the active area of the semiconductor wafer.

In view of these considerations, the choice of an appropriate chemical etchant is a non-trivial problem. It must be tailored to the particular problems and considerations inherent in an etching module and the underlying chemical etching process. Further, the liquid etchant ultimately chosen introduces a host of special problems related to the preparation and handling of the liquid etchant prior to and during use. These problems require creative solutions. The present invention addresses all of these concerns.

SUMMARY OF THE INVENTION

The present invention provides a chemical etching system and associated method in which a mixture of an acid (preferably sulfuric acid) and hydrogen peroxide serve as the etchant for removing residual copper from an edge bevel region of a semiconductor wafer. The etching system includes a dilution module where concentrated sulfuric acid and concentrated hydrogen peroxide are diluted to the appropriate concentrations and then stored. To reduce the likelihood that oxygen bubbles (from hydrogen peroxide decomposition) will appear in the etchant solution, stored sulfuric acid and hydrogen peroxide are mixed immediately prior to use. In this manner, the dissolved oxygen concentration in the hydrogen peroxide decreases well below the saturation level.

One aspect of the invention provides a chemical dilution module for providing liquid etchant to an etching system that etches unwanted copper from a semiconductor wafer. The chemical dilution module may be characterized by the following features: (a) an acid dilution tank for mixing concentrated acid and water to a specified concentration; (b) a hydrogen peroxide dilution tank for diluting concentrated hydrogen peroxide to a specified concentration; and (c) an in-line mixing area for combining hydrogen peroxide from the hydrogen peroxide dilution tank with diluted acid. In this design, mixing occurs principally when hydrogen peroxide and acid are delivered to the etching system. Thus, the module may include a line directly connecting the in-line mixing area to the etching system. In a preferred embodiment, the chemical dilution module includes at least one metering pump (such as a syringe pump) which provides dilute acid and dilute hydrogen peroxide to the in-line mixing region.

Preferably, the acid is sulfuric acid and its concentration is between about 5 and 15% by weight in the sulfuric acid dilution tank and the concentration of hydrogen peroxide is between about 10 and 30% by weight in the hydrogen peroxide dilution tank.

The sulfuric acid may be prepared and stored for use in a multi-stage system. Thus, for example, in addition to the dilution tank, the chemical dilution module may include an acid measure tank for holding a supply of concentrated sulfuric acid (from a source within an integrated circuit fabrication facility for example) and delivering the concentrated sulfuric acid to the sulfuric acid dilution tank. The dilution tank then dilutes the concentrated sulfuric acid. After that, the diluted may be delivered to a sulfuric acid use tank connected between the sulfuric acid dilution tank and the in-line mixing area. In this manner, the sulfuric acid use tank holds sulfuric acid that has been diluted and allowed to cool in the sulfuric acid dilution tank and makes the diluted sulfuric acid available for in-line mixing. The sulfuric acid use tank may be outfitted with a level sensor that triggers filling of the use tank with diluted sulfuric acid from the sulfuric acid dilution tank. Further, the sulfuric acid dilution tank may include a level sensor which triggers delivery of first water and then concentrated sulfuric acid to the sulfuric acid dilution tank.

In a preferred embodiment, the hydrogen peroxide dilution tank includes a gas purge bubbler, which purges dissolved oxygen from the hydrogen peroxide in the hydrogen peroxide dilution tank and also facilitates mixing of water and hydrogen peroxide. The purge gas should be an inert gas such as nitrogen, helium, or argon. The hydrogen peroxide dilution tank may also include a level sensor which triggers delivery of water and concentrated hydrogen peroxide to the hydrogen peroxide dilution tank.

Another aspect of the invention provides a method of delivering liquid etchant to an etching system that etches unwanted copper from a semiconductor wafer. The method may be characterized by the following sequence: (a) diluting concentrated acid in a acid dilution tank; (b) diluting concentrated hydrogen peroxide in a hydrogen peroxide dilution tank; and (c) in a single line to the etching system, mixing dilute acid and dilute hydrogen peroxide from the dilution tanks. In this manner, mixing occurs principally when hydrogen peroxide and sulfuric acid are drawn for delivery to the etching system. After mixing, the method involves delivering the mixed hydrogen peroxide and acid as the liquid etchant to the etching system.

In some embodiments, the method may also involve (i) delivering concentrated sulfuric acid from an acid measure tank to the sulfuric acid dilution tank for dilution and then (ii) storing the diluted sulfuric acid from the sulfuric acid dilution tank in a sulfuric acid use tank. As mentioned above, the sulfuric use tank makes dilute sulfuric acid available for the mixing with dilute hydrogen peroxide.

To ensure availability of dilute sulfuric acid, the method may involve detecting that the level of dilute sulfuric acid in the use tank has fallen below a preset level and then filling the use tank with diluted sulfuric acid from the sulfuric acid dilution tank. To dilute concentrated sulfuric acid as needed, the method may further include (i) detecting that the level of dilute sulfuric acid in the dilution tank has fallen below a preset level; and (ii) delivering first water and then concentrated sulfuric acid to the sulfuric acid dilution tank. Further, mixing of the water and the acid may be promoted by bubbling nitrogen or other inert gas through the acid dilution tank.

Similarly, the hydrogen peroxide may be made available by (i) detecting that the level of dilute hydrogen peroxide in the dilution tank has fallen below a preset level; and (ii) delivering water and concentrated hydrogen peroxide to the hydrogen peroxide dilution tank. To removed dissolved oxygen from the hydrogen peroxide, the method may involve bubbling a purge gas through the dilute hydrogen peroxide in the dilution tank to thereby purge dissolved oxygen gas from the dilute hydrogen peroxide.

As indicated, the dilute sulfuric acid and the dilute hydrogen peroxide may be delivered for mixing by the action of at least one metering pump. This allows the module to perform a backstroke with the at least one metering pump to prevent dripping of the liquid etchant in the etching system after delivery of the liquid etchant to the etching system.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, this invention pertains to removal of unwanted copper metal from an edge bevel region of a semiconductor wafer. A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997.

Figure 1A:
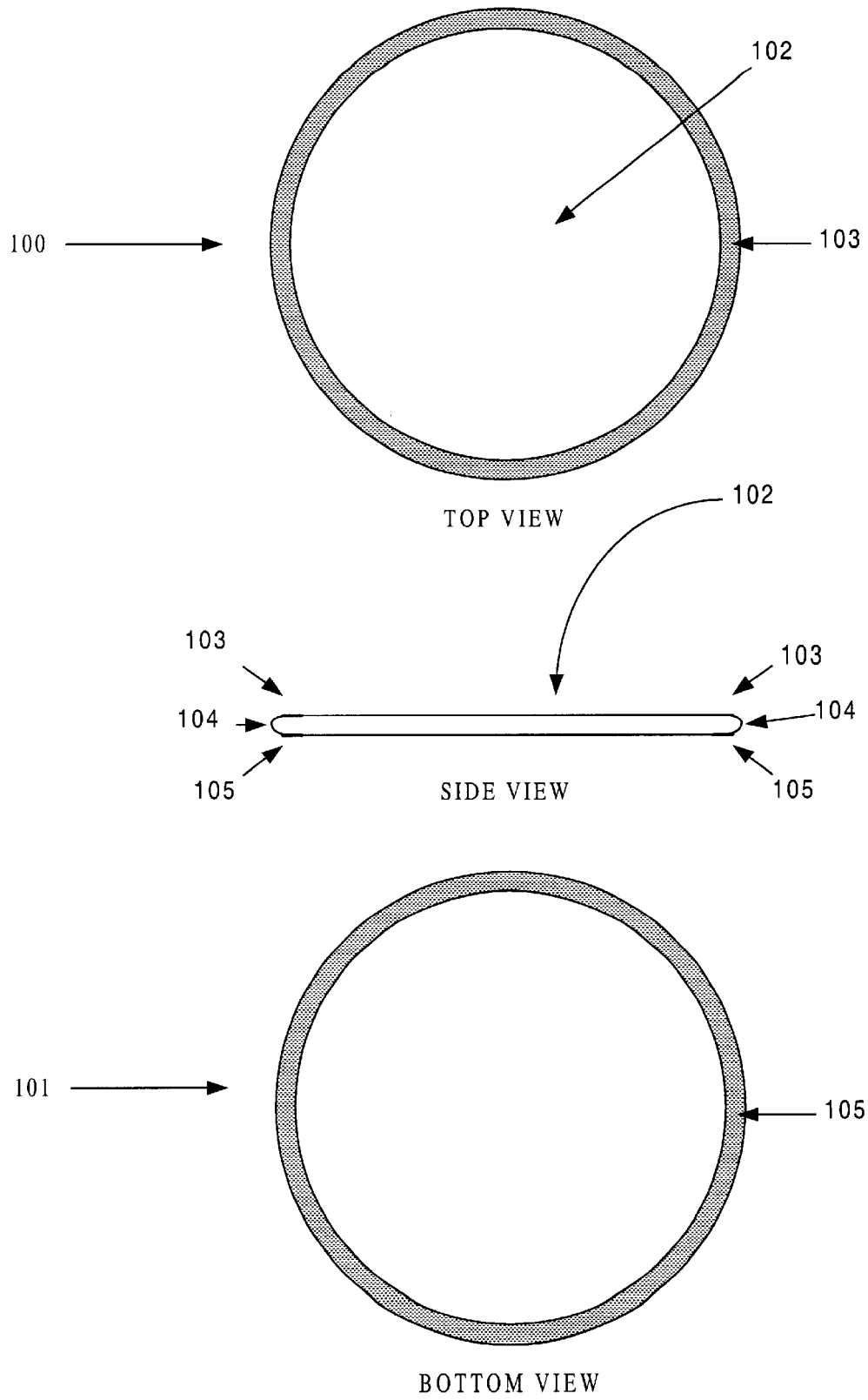
FIG. 1A is an illustration of a semiconductor wafer showing the location of the edge bevel region that is etched in accordance with this invention.

To facilitate understanding the concepts of this invention, a schematic illustration of a semiconductor wafer is shown in FIG. 1A. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the present invention allows the interior active surface region to extend the useable active region to within at least 1.5 and 4 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Unwanted metal such as copper may deposit on regions 103, 104, and 105. Some metal may also deposit over the entire backside 101. One use of the present invention is to remove unwanted metal from these regions without substantially affecting metal deposited on active region 102.

A "post-electrofill module" (PEM) or "EBR module" as referred to in this invention is a module that is specifically designed to carry out the edge bevel removal (EBR) process, as well as a backside etch (BSE) process, in most cases. It may also perform processes ancillary to the EBR, including pre-rinsing, rising, acid washing and drying. An integrated-electrofill module as referred to in this invention is a module that carries out electrofill.

Figure 1B:
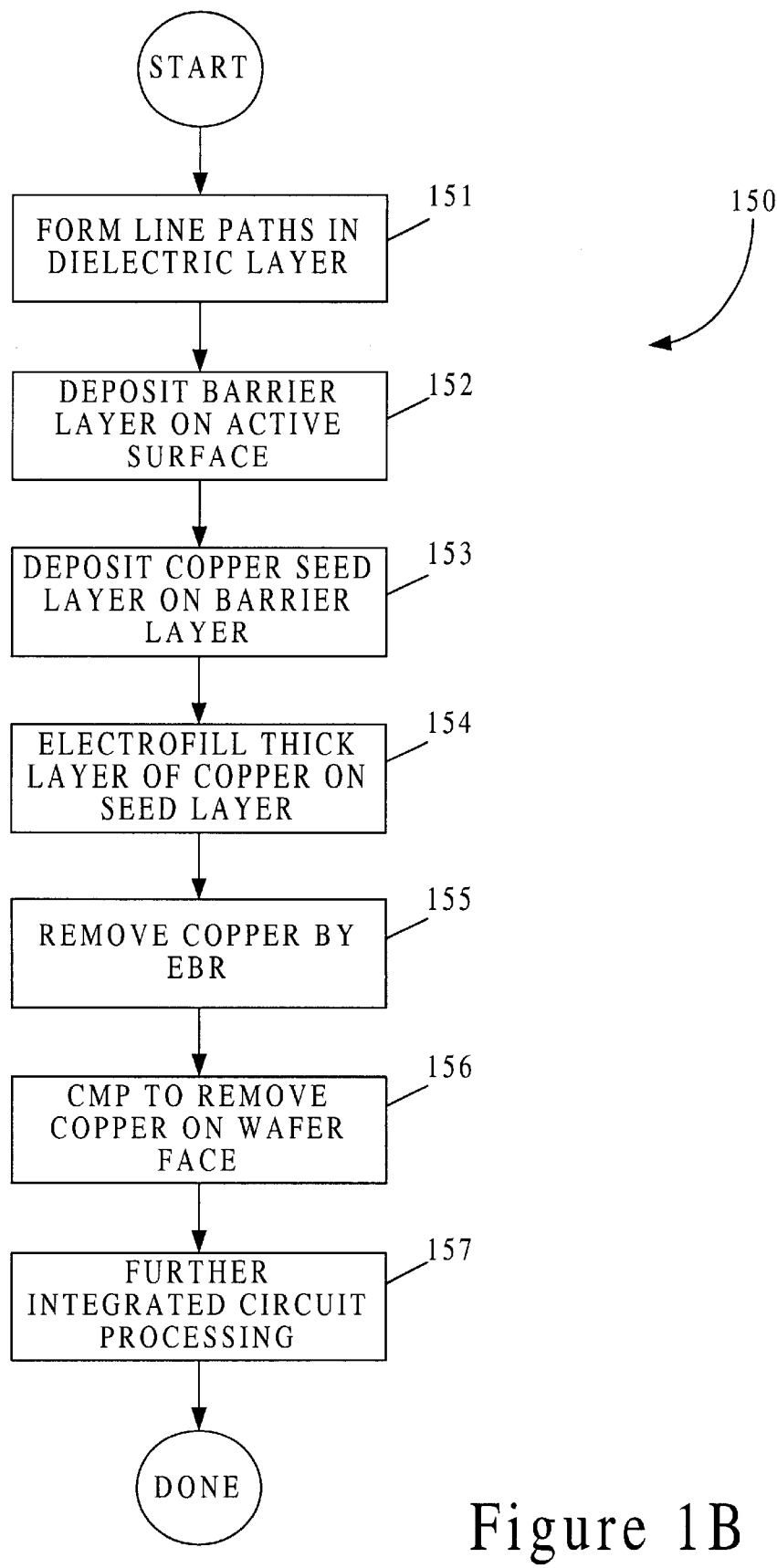
FIG. 1B is a process flow diagram illustrating relevant operations employed to form conductive copper lines a Damascene process in the context of this invention.

While details of the preferred embodiment may be found below in this application, a short description of a typical Damascene process will now be provided to facilitate understanding the context of the present invention. A typical Damascene process flow 150 is illustrated in the flowchart of FIG. 1B. Process 150 begins with formation of line paths 151 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 152 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. However, before electrofilling, a conductive surface coating must be applied. In the depicted process, this is accomplished by depositing a copper seed layer on the barrier layer at 153. A PVD process such as sputtering may be employed to this end. The wafer is then electrofilled at 154 with a thicker layer of copper over the seed layer, by electroplating using an electroplating solution. The copper is deposited to a thickness that completely fills the various line paths in the dielectric layer.

As mentioned, it is desirable to use as much of the wafer surface for active circuitry as possible. While it is generally a straightforward matter to shield unwanted areas from an electroplating solution, the same kind of shielding cannot be so easily and precisely done with PVD. Thus deposition of PVD copper in some unwanted areas cannot be avoided. This copper must be removed, and this is accomplished by the edge bevel removal (EBR) and/or backside etch BSE processes of the present invention.

With EBR at 155, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. More specifics of the EBR process are described below. After EBR, the electroplated copper is planarized, generally by chemical-mechanical polishing (CMP) down to the dielectric at 156 in preparation for further processing (illustrated at 157), generally the addition of subsequent dielectric and metalization layers.

Figure 1C:
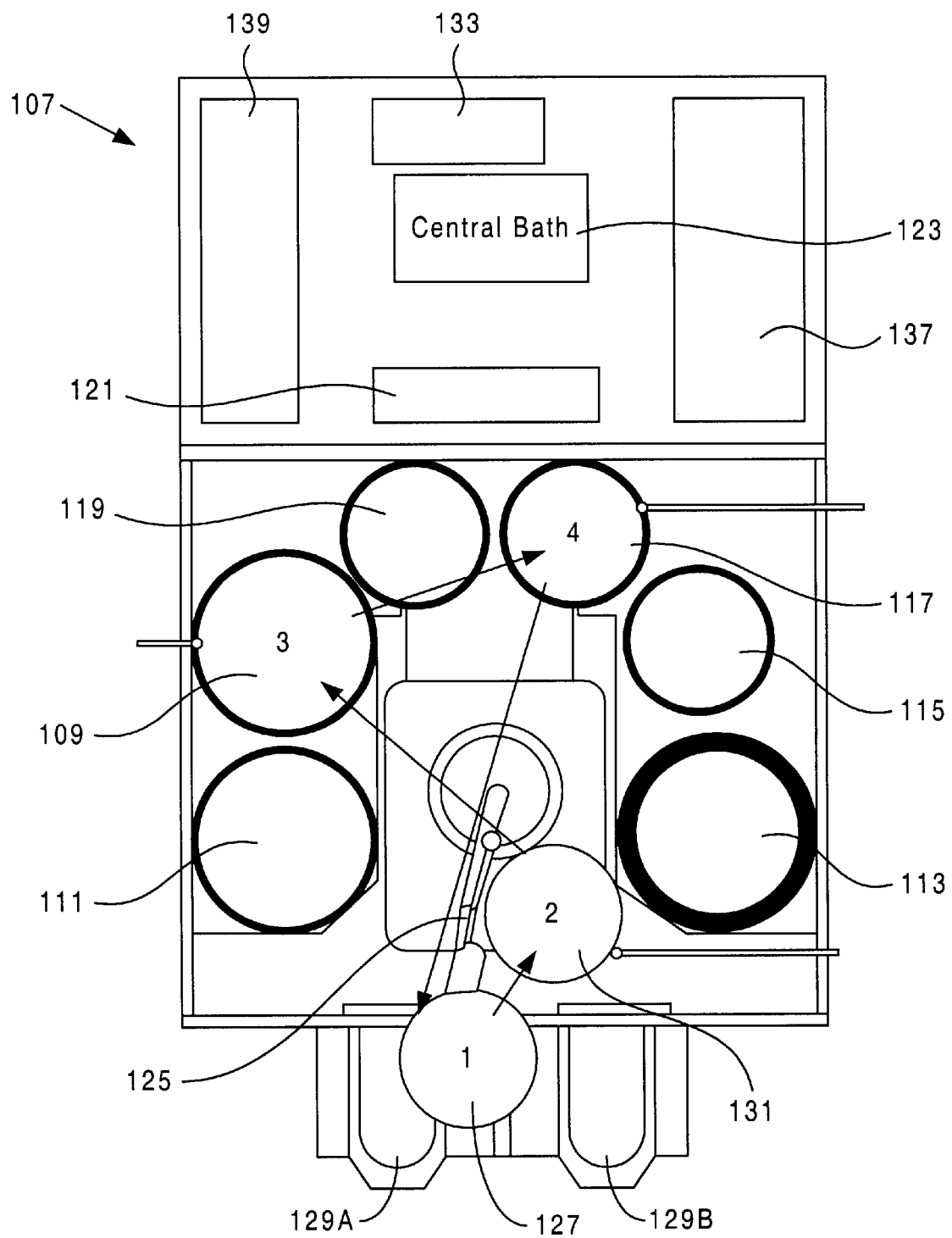
FIG. 1C is a block diagram illustrating a group of modules used to form copper conductive lines on an integrated circuit.

FIG. 1C depicts an electrofill system 107 in which the invention may reside. The specific system includes three separate electrofill modules 109, 111 and 113. System 107 also includes three separate post electrofill modules 115, 117 and 119. Each of these may be employed to perform each of the following functions: edge bevel removal, backside etching, and acid cleaning of wafers after they have been electrofilled by one of modules 109, 111, and 113. System 107 also includes a chemical dilution module 121 and a central electrofill bath 123. This is a tank that holds the chemical solution used as the electroplating bath in the electrofill modules. System 107 also includes a dosing system 133 that stores and delivers chemical additives for the plating bath. A chemical dilution module 135 stores and mixes chemicals to be used as the etchant in the post electrofill modules. A filtration and pumping unit 137 filters the plating solution, for central bath 123 and pumps it to the electrofill modules. Finally, an electronics unit 139 provides the electronic and interface controls required to operate system 107. Unit 139 may also provide a power supply for the system.

In operation, a robot including a robot arm 125 selects wafers such as a wafer 127 from a wafer cassette such as a cassette 129A or a cassette 129B. Robot arm 125 may attach to wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operation completes, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121.

Preferably wafer 127 is precisely aligned within post electrofill module 117 without making use of aligner 131. To this end, the post electrofill modules may be provided with an alignment chuck as referenced elsewhere herein. In alternative embodiment, wafer 127 is separately aligned within aligner 131 after electrofill and prior to edge bevel removal in module 117.

After processing in post electrofill module 117 is complete, robot arm 125 retrieves wafer 127 from the module and returns it to cassette 129A. From there the cassettes can be provided to other systems such as a chemical mechanical polishing system for further processing.

Figure 2A:
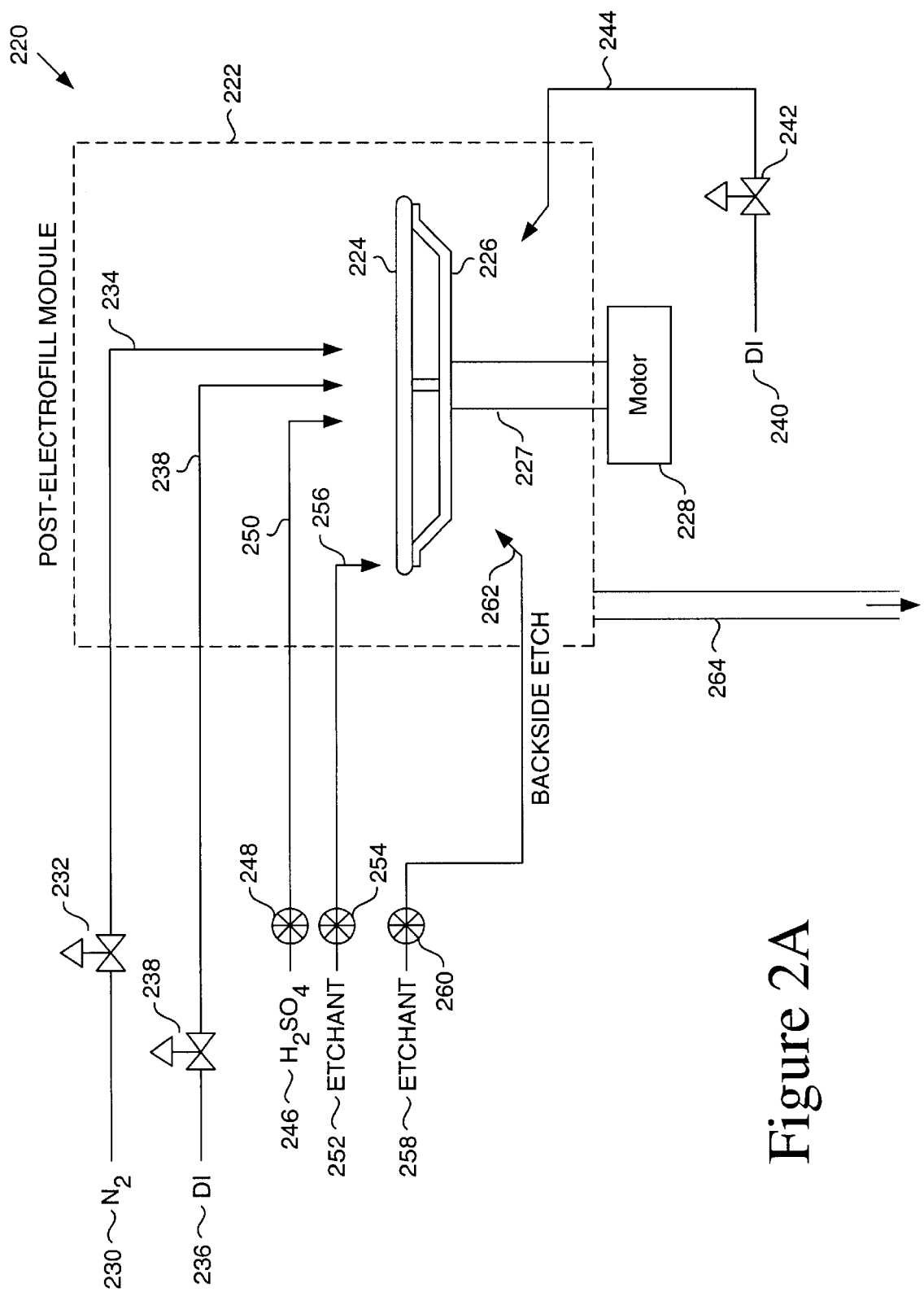
FIG. 2A is a block diagram illustrating various elements of a post-electrofill module in accordance with one embodiment of this invention.
Figure 3:
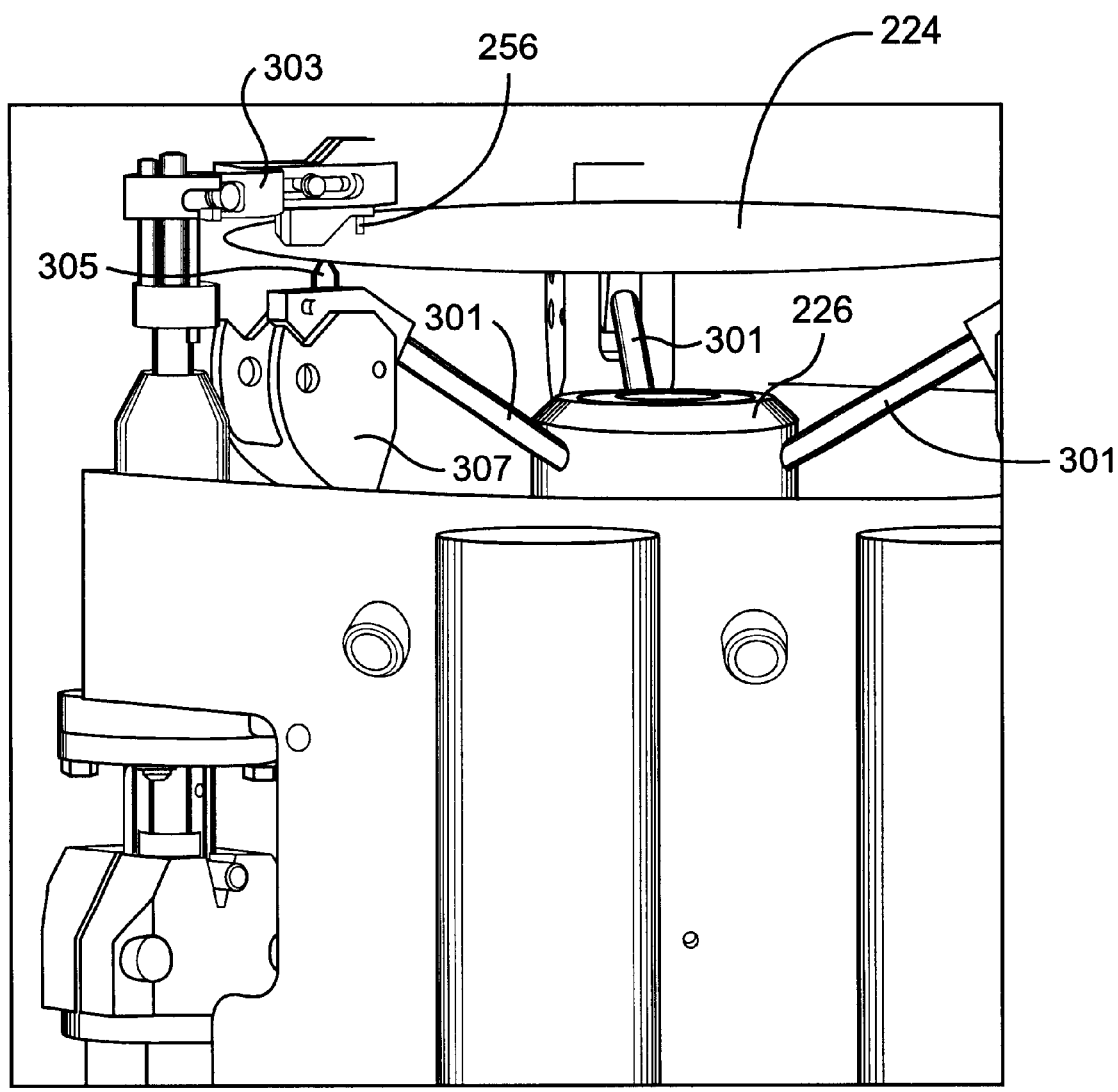
FIG. 3 is a perspective diagram of edge bevel removal components that may be employed in a post-electrofill module in accordance with one embodiment of this invention.

FIG. 2A schematically illustrates one preferred post-electrofill module 220 suitable for use with this invention. FIG. 3 presents such module in a perspective view. As shown, module 220 includes a chamber 222 in which a semiconductor wafer 224 rotates. Wafer 224 resides on a wafer chuck 226 which imparts rotational motion to wafer 224. Chamber 222 is outfitted with a drain and associated drain line 264. The drain allows the various liquid streams provided to chamber 222 to be removed for waste treatment.

A motor 228 controls the rotation of chuck 226. Motor 228 should be easy to control and should smoothly transition between various rotational speeds. It may reside within or without chamber 222. In some embodiments, to protect against damage from liquid etchant, motor 228 resides outside of chamber 222 and is separated therefrom by a seal through which a rotating shaft 227 passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Preferably, motor 228 can rapidly accelerate and decelerate (in a controlled fashion) chuck 226 and wafer 225 at rotation rates between 0 and about 2000 rpm. The motor speed and other operations should be controllable by a computer.

Chuck 226 may be of any suitable design that holds wafer 224 in position during various rotational speeds. It may also facilitate alignment of wafer 224 for the etching process. A few particularly preferred examples of wafer chucks are described in U.S. patent application Ser. No. 09/558,249 previously incorporated by reference.

Chamber 222 may be of any suitable design that confines the liquid etchant within its interior and allows delivery of the various fluids to wafer 224. It should be constructed of an etchant resistant material and include ports and nozzles for the various liquid and gaseous streams used during etching and cleaning.

Gaseous nitrogen is provided to post electrofill module 220 from a source of nitrogen 230. Preferably, this is a central source of nitrogen available to various processes throughout an integrated circuit manufacturing facility. Nitrogen from source 230 is delivered to chamber 222 under the control of a valve 232. The gaseous nitrogen is delivered into chamber 222 via a line and nozzle 234 positioned to deliver the nitrogen directly onto wafer 224, preferably at the center of the wafer. This enables blowing dry, particle-free nitrogen at the center, upper face of the wafer. This orientation of the nozzle increases the drying rate at the wafer center, where the centrifugal forces are small. Other suitable gas drying sub-systems may be employed as will be appreciated by those of skill in the art. For example, drying gases other than nitrogen may be employed in some embodiments. Also, the orientation and blowing direction of the nitrogen nozzle may be widely varied.

The next input of interest to module 220 is a source of deionized water 236. As with the source of nitrogen 230, the source of deionized water 236 preferably originates with a central source within an integrated circuit fabrication facility. The deionized water is delivered to chamber 222 under the control of a valve 238 and through a delivery line and nozzle 238. Note that line 238 directs deionized water onto the top of wafer 224. This enables rinsing of the wafer's top side. A preferred nozzle sprays fluid as a thin "fan" that spreads out over the inner three-quarters of the wafer diameter. Preferably, the thickness of the fan is no more than about one-fifth of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing. Alternatively, a simple stream of deionized water can be directed at the center of the wafer (or any other location on the wafer).

A similar deionized water system provides a stream or fan of deionized water to the backside of wafer 224. This deionized water is provided from a source of deionized water 240, which may be the same as source 236. A valve 242 controls the flow of deionized water onto the backside of wafer 224 via a line and nozzle 244. The nozzle associated with 244 may have the same design criteria as just mentioned for nozzle 238. The goal is to rinse etchant from the backside of wafer 224.

In a preferred embodiment, an acid rinse is conducted on the front side of wafer 224. To this end, a source of sulfuric acid 246 provides sulfuric acid to a delivery line and nozzle 250. Other acids may be used as appropriate. Preferably, the source 246 of sulfuric acid is a chemical dilution module described below. Preferably, this module includes a valve that controls the delivery of sulfuric acid to module 220. The flow of sulfuric acid into chamber 222 may be monitored by a mass flow meter 248. Note that in the depicted embodiment nozzle 250 is oriented to direct sulfuric acid onto the center of the front side of wafer 224. After the acid is delivered to the center of the wafer it then spins out into the edge of the wafer during rotation. This solution is applied to remove residual copper oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 238.

Liquid etchant used to remove copper or other unwanted metal from portions of wafer 224 is provided from a source of liquid etchant 252 as shown. Preferably, this source is provided by the above-mentioned chemical dilution module. The etchant passes through a mass flow meter 254 and is delivered to wafer 224 via a line and nozzle 256. Preferably, the etchant is delivered to the edge bevel region of wafer 224 to remove PVD copper in that region.

A second liquid etchant stream may be delivered to the backside of wafer 224 in order to etch off any copper or other unwanted metal that may have been deposited on the backside of wafer 224. As shown, such etchant is delivered from an etchant source 258. Preferably, this is the same source as 252. In other words, the chemical dilution module provides etchant for both edge bevel removal and backside etch. As shown, etchant from source 258 passes through a mass flow meter 260 and through a nozzle 262, which directs it onto the backside of wafer 224.

Figure 2B:
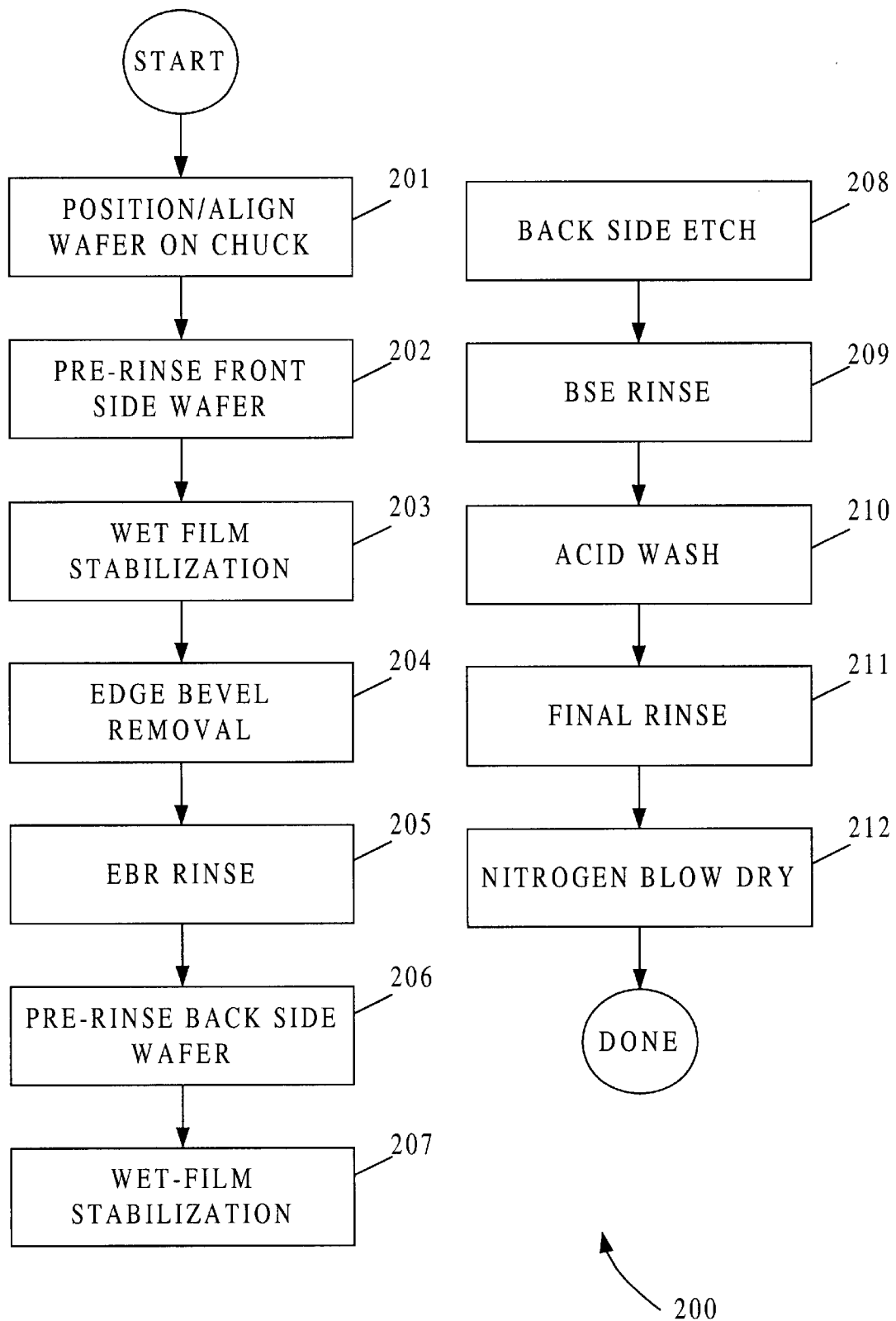
FIG. 2B is a process flow diagram illustrating a typical sequence of operations employed with a post-electrofill module in accordance with an embodiment of this invention.

A specific preferred embodiment of the EBR process is illustrated in FIG. 2B. The EBR process 200 can be carried out by a post-electrofill module, such as module 220 of FIG. 2A, that is specifically designed to carry out the EBR process. The process begins at 201, with a robot arm placing the wafer on the module chuck for EBR processing. The wafer is typically aligned and placed on a set of support pins that hold the wafer in place by static friction, even when the wafer is later rotated. After the robot arm retracts, deionized water is applied to the front of the wafer and the wafer is spun at about 200–400 rpm in order to prerinse the wafer of any particles and contaminants left over from previous steps. See 202. The deionized water is then turned off and the wafer is spun up to a speed of between about 350–500 rpm, which creates a uniformly thin layer of deionized water (wet-film stabilization). See 203. This wet-film stabilization facilitates an even distribution of the etchant over the front side of the wafer. At this time, at the latest, any alignment pins or clamps that were used to precisely align the wafer in the chuck are retracted from the edge of the wafer.

After wet-film stabilization 203, the core feature of the EBR, actual removal of the edge bevel metal 204 is performed. The EBR etchant is typically applied to the surface of the wafer using a thin nozzle tube, which has a nozzle opening at or near its end. When dispensing a small amount of fluid onto a surface as such, three flow regimes can generally result. The first regime is edge beading, where surface tension forces dominate the behavior of the fluid, the second is viscous flow, where viscous forces predominate, and the third is inertial, where inertial forces predominate and the fluid tends to spray. As explained below, the preferred flow regime is the viscous flow. In a specific example, an EBR dispense arm is positioned over the wafer edge as described below with reference to FIG. 4B. Then EBR is performed under the following conditions: a total of about 2 to 4 milliliters etchant is delivered at a rate of about 0.25 to 2 milliliters/second (more preferably about 0.5 to 1 milliliters/second) for a 200 millimeter wafer. A further discussion of the desired flow conditions will be presented below.

During EBR, some etchant may flow onto the backside of the wafer and etch it. An alternative embodiment for practicing the present invention is to have the wafer facing upside down, and to apply the etchant to the backside edge.

After the required amount of liquid etchant has been applied to the edge of the wafer, deionized water is again applied to the front side of the wafer as a post-EBR rinse 205. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time as commencement of step 205, the backside of the wafer is pre-rinsed 206 with deionized water, which is wet-film stabilized 207 in much the same manner that the front side of the wafer was (e.g., the wafer rotation speed is held at about 350 to 500 rpm). After the flow of deionized water to the wafer backside ends, a backside etch operation 208 is performed—generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.

The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500–700 rpm for the remainder of the BSE. The portions of the backside blocked by the arms will differ at the two speeds, thus ensuring complete coverage. Overall, the BSE process typically takes 1–4 seconds and uses 1 to 5 cubic centimeters of the preferred etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water to rinse any liquid etchant, particles and contaminants remaining from the BSE. See 209. Then the flow of deionized water to the front side ends and about 2 to 4 milliliters of a dilute acid, generally less than about 15% by weight acid, is applied to the front side of the wafer to remove residual metal oxide and remove the associated discoloration. See 211. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15–30 seconds at about 300–400 milliliters/min. Finally the wafer can be spun and blow-dried, as desired, on both sides with nitrogen. See 212. Generally, any drying step is carried out at about 750–2000 rpm for about 10 to 60 seconds, and necessitates a clamping for the wafer once it reaches about 750 rpm. Many embodiments for the clamping mechanism are possible, and some of these are discussed in more detail below. After this processing in the PEM is completed, a robot arm picks up the wafer and puts it in a cassette.

Turning again to FIGS. 2A and 3, some features of the PEM will be described in further detail. First, note that wafer 224 rides on support pins 305 (located on wafer chuck arms 301) by static friction. Preferably, the support pins 305 are located from about 5 to 20 millimeters, more preferably about 5 to 10 millimeters, in from the edge of wafer 224. The design of the support pins is determined by the need to supply enough friction to 1) keep the wafer from flying off the chuck if it is aligned slightly off center (i.e. when aligned to the tolerance of the specification of the edge bevel removal process), 2) not slip as the wafer is accelerated (at typically a rate of 50 to 300 rpm/sec (100 rpm/sec in a specific embodiment)) from rest to the EBR rotation rate, and 3) not shed or generate particles. As the wafer's rotational speed increases, however, it reaches a velocity at which the static friction from resting on the pins can no longer constrain it due to small misalignments and the associated centripetal force. To prevent the wafer from flying off chuck 226 at such velocities, clamping cams 307 may be employed. The design of suitable cams is described below. For now, simply understand that at defined wafer rotational velocities, the clamping cams rotate into a position that locks wafer 224 in place.

Next note that a dispense-arm 303 functions to hold the dispense nozzle 256 and move the nozzle into an accurately controlled location over the wafer 224 during the etching step of the process. The dispense-arm design is not particularly restrictive. It can move down from above the wafer, in from the side, swing in from the edge, rotate down from above, or any combination of these movements. However, the location of the nozzle is preferably reproducibly accurate to within less than about 0.5 mm (more typically less than about 0.2 mm) so that the etched region is mechanically under controlled. Any suitable pneumatic actuator, solenoid, motor controlled gear, or servo controlled motor can activate the arm. The dispense-arm should move the dispense nozzle accurately to the edge of the wafer and move the nozzle out of the way to allow the wafer to be transferred into and out of the chuck. The materials of construction should be resistant to the particular chemical etching solution used. If the preferred etchant disclosed herein is used, certain stainless steels (e.g. 303, 625, 316L etc.), ceramics ($Al_2O_3$, zirconia), Tantalum, and plastic coated metals (polypropylene, polyethylene, PTFE, PVDF) are good choices because they will resist chemical attack, and have sufficient mechanical strength (without creep or flow) to maintain the necessary stringent mechanical tolerances. Similar design considerations hold for the wafer chuck.

Figure 4A:
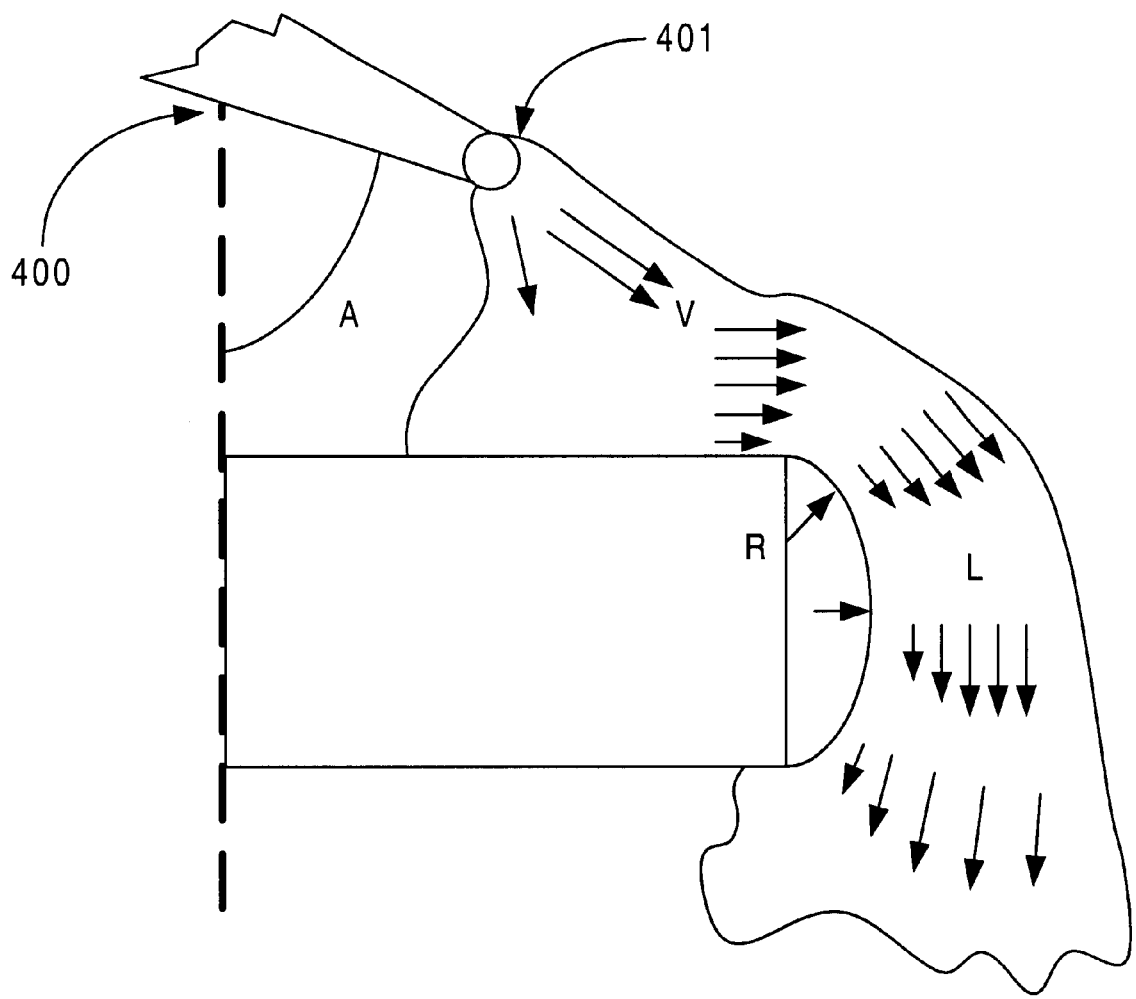
FIG. 4A is a schematic illustration of etchant being delivered to a wafer edge bevel via an etchant dispensing nozzle in a manner that constrains the etchant to the edge bevel region of the wafer.

FIG. 4A schematically shows a nozzle 400 delivering etchant to the front of the wafer for EBR. Relevant parameters for defining the desired etchant flow regime include (i) the thickness of the fluid stream (L), which is essentially determined by the diameter of the nozzle, (ii) the radius of curvature of the wafer (R), and (iii) the radial velocity of the fluid stream (V), which is determined by the radial component of the etchant's exit velocity from the nozzle and to some degree the centripetal acceleration from rotation of the wafer. In a plane containing the normal to the wafer, the nozzle 401 may be angled by A degrees (generally between about 30 to 70 degrees) with respect to the normal of the wafer. The component of the etchant's exit velocity from the slot nozzle in the plane of the wafer is thus the product of the total exit velocity and sin(A). The viscosity ($\mu$) and density ($\rho$) of the etchant fluid also contribute to the flow regime function. The nozzle also is angled rotationally at 0 to 90 degrees with respect to the wafer tangent in the plane of the wafer.

Figure 4B:
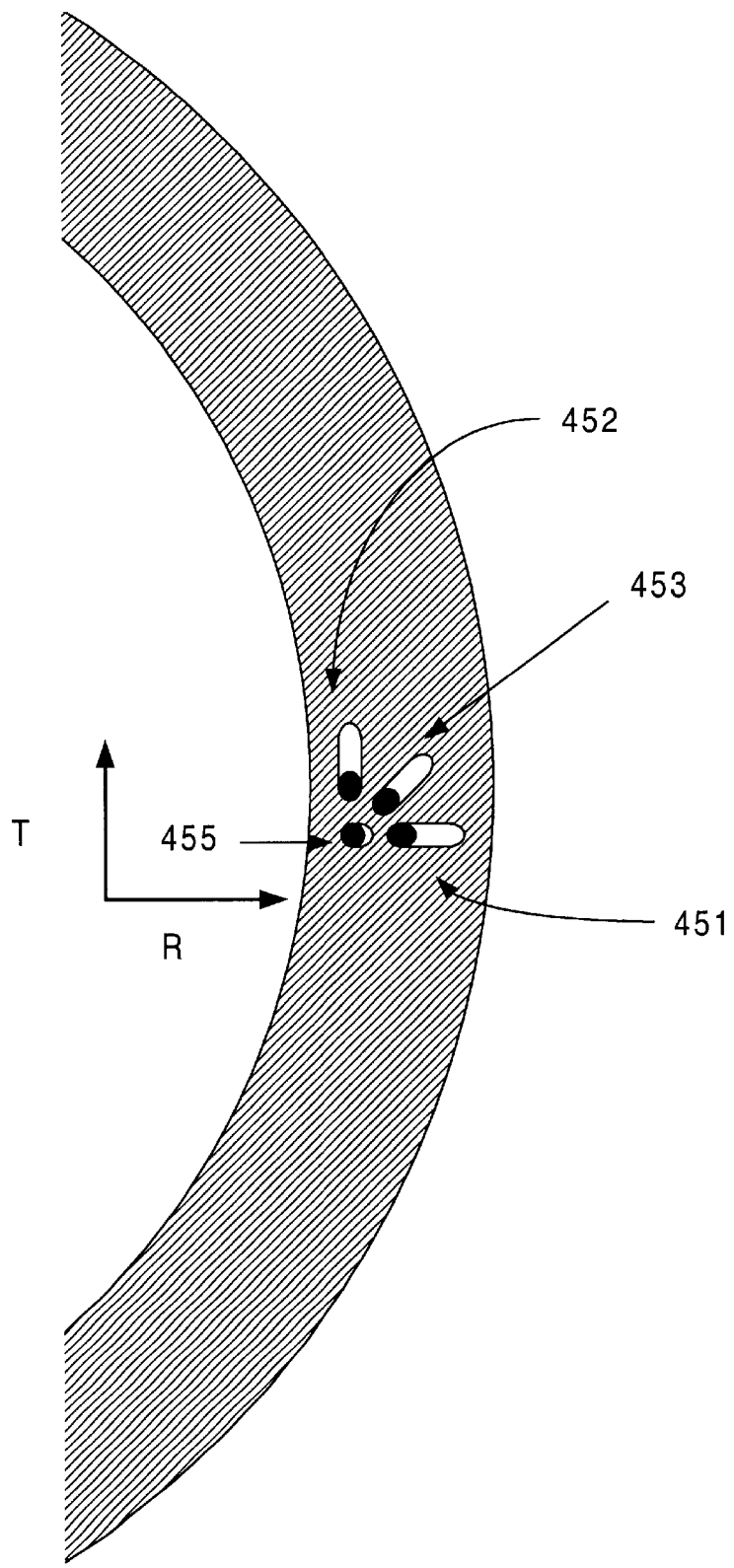
FIG. 4B is a top view of a. wafer on which etchant is delivered at a controlled orientation via an etchant delivery nozzle.

FIG. 4B schematically shows a nozzle at four different orientations with respect to a wafer. Each orientation differs from the others in its angle with respect to the wafer's tangent and/or its angle with respect to the wafer's normal (the "z-direction" out of the plane of the page). Considering first the radial/tangential angle (in the plane of the wafer), if the nozzle is angled purely in the radial direction R (90 degrees with respect to the wafer tangent), then it will deliver etchant fluid with a radial angle as shown by nozzle 451. And if the nozzle is angled purely in the tangential direction T (0 degrees with respect to the wafer tangent), then it will deliver etchant fluid with a tangential angle as shown by nozzle 452. The nozzle can and often is angled somewhere between the purely radial and purely tangential directions as illustrated by nozzle 453. As explained, the nozzle orientation can also vary with respect to the wafer normal. Each of nozzles 451, 452, and 453 is angled to the same degree with respect to the wafer normal. Nozzle 455, however, is more steeply angled toward the normal.

As mentioned, the three flow regimes of interest include (i) edge beading, where surface tension forces dominate the behavior of the fluid, (ii) viscous flow, where viscous forces predominate, and (iii) inertial, where inertial forces predominate and the fluid tends to spray. Several experimental observations and calculated trends were made. Larger nozzles and high flow velocities lead to thicker fluid films with more inertia, which tend to fly off the edge of the wafer rather than wrap around the side and back. Combinations of low flow, low rotation, and a wide nozzle result in films that bead at the edge, and sporadically weep from the edge to the back, where they fly off in spurts. A high rotation rate results in very short etchant/surface exposure times and the etchant flying off the front surface (not wetting the sides and back). The experiments and calculations indicate that the thickness of the applied etchant stream should be approximately the same size or smaller than the radius of curvature of the wafer edge. There are a range of flow rates (fluid velocities) and rotation rate that are effective in producing the required viscous flow conditions. Generally, lower flow rates were effective with higher rotation rates and vice versa.

The three flow regimes can be approximately correlated to values of a dimensionless number given by $\mu R/VL^2\rho$. The parameters of this dimensionless number were discussed above in conjunction with FIG. 4A. Using this dimensionless number, numbers above about 0.001 correspond to the edge beading regime, numbers below about 0.0001 correspond to the inertial regime, and numbers in between these correspond to the viscous flow regime.

Edge beading is not desirable for practicing the invention because in this regime the fluid forms in droplets rather than evenly flowing over the surface of the wafer. In addition, the movement of such droplets is somewhat unpredictable, and they can flow in from the front edge of the wafer, where the fluid is dispensed from the nozzle, back toward the center. The inertial regime is undesirable because in this regime the fluid tends to "fly off" the front edge of the wafer, due to the radial component of the fluid's velocity, rather than flowing over the side edge. This radial velocity is a result of the exit velocity of the fluid from the nozzle and to a smaller degree the centripetal acceleration of the rotating wafer. The viscous regime is the regime one wishes to operate in because in this regime the fluid evenly covers the front edge of the wafer where the etchant is applied. The viscous fluid also flows over the side edge and to some degree the back edge of the wafer due to the radial component of the fluid's velocity.

Using typical etchant solutions, such as the preferred $H_2SO_4$ and $H_2O_2$ solution described below, it has generally been found that the thickness of the etchant stream as delivered to the wafer should be about the same size or slightly smaller than the radius of curvature of the wafer. Using the preferred etchant, and processing a standard wafer of 200 millimeters diameter, 0.75 millimeters thickness and 0.15 millimeter radius of curvature, the following parameters were found to have worked well: a nozzle diameter of between about 0.1 and 1.0 millimeters, a wafer rotation rate of between about 100 and 500 rpm, an exit velocity of between about 40 and 400 cm/sec, a angle for the nozzle of 30 to 70 degrees from the normal of the wafer, and a rotation angle for the nozzle of about 0 to 90 degrees with respect to the direction of rotation (the tangential direction, T, of FIG. 4B). It is generally desirable to have the nozzle located as close to the wafer as mechanically practical. Further, the location of the nozzle with respect to the wafer edge, combined with its location above the wafer, determines the etching region which is dependent on the particular application. It has been found that the EBR works well when the nozzle exit is about 0.5 to 5 millimeters above the surface of the wafer, and about 0 to 5 millimeters inside its outer edge. The nozzle tube generally should be narrow and long enough to ensure that the fluid exits in a stream that stays roughly parallel before it hits the wafer.

The rotation rates specified herein were determined through experimentation and calculation, specifically for a 200 millimeter wafer part size and specific viscosity of etchant. However, the invention is not specific to that part size or etchant viscosity. Similar experiments and calculations can be performed to optimize the nozzle size, viscosity, flow conditions and rotation rates for other wafer sizes. The appropriate rotation rate for other size wafers can be estimated by maintaining the same centrifugal acceleration ($v^2/r$). Since the tangential velocity is $v=2\pi\omega r/60$ ($\omega$ is the rotation rate in rpm, r is the wafer radius in cm, v is the velocity in cm/sec), the centrifugal acceleration is given by $a_c=(2\pi\omega/60)^2 r$. Therefore, neglecting viscous forces and time of flight considerations, the appropriate scaling is therefore $r_1/r_2=\omega_2^2/\omega_1^2$.

The nozzle hole diameter should be optimized along with the flow velocity and rotation rate to apply a continuous film of fluid onto the wafer. Maintaining the nozzle hole diameter over a fixed potion of nozzle length is necessary to develop an approximately parallel (non-diverging) exiting fluid flow profile. The fluid nozzle impingement imparts a sufficiently large radial velocity component so that the fluid will rapidly flow around the wafer edge. Preferably, the nozzle shape is tubular. In a specific embodiment, the nozzle is tubular and about 0.5 to 1 millimeter in length.

In an alternative embodiment, the nozzle has a slot shape. If a slot nozzle is used, its length should be determined with reference to the width of the etched region (ring) that is to be produced. The slot width should be small enough so as to minimize chemical usage, splashing of etchant, and beading of the dispensing volume (avoiding the dispense having discrete drops rather than a stream). Typical slot nozzles tested that were found to be effective were about 2–4 millimeters in length, allowing application of etchant over 1–5 mm of the wafer edge. Useful slot widths were in the range of about 0.1–0.3 millimeters.

Keep in mind that a large tube (dispensing spray diameters approaching the dimensions of the edge to be etched) could be used, but would not be as efficient as the approaches described here because of the large amount of fluid needed. The use of the larger flow volume near the rotating chuck cams and arms also increases the propensity for splashing back onto the frontside device areas of the wafer as well. The disclosed design enables controlled dispensing of the etchant from the top of the wafer, over the side, to the back edge, and even controlled removal of the metal from the underside edge of the wafer, without physically touching the wafer and thereby contacting the active surface.

Various considerations influence the choice of a liquid etchant. As mentioned above, the liquid etchant should etch the unwanted metal rapidly at room temperature (e.g., >400 Å/sec). But, it should not aggressively attack the mechanical and electrical components of the etch system. Nor should it generate dangerous by-products during the etching reaction. Preferably, the components of the liquid etchant should include only those materials readily available in normal integrated circuit manufacturing facilities. Other beneficial properties of a liquid etchant include a long shelf life (preferably without stabilizers), a consistent etching rate over time, low cost, and environmental friendliness.

Preferably, the liquid etchant includes an acid and oxidizer. Examples of acids that are useful include sulfuric acid, hydrohalic acids, chromic acid and nitric acid. A preferred etchant for copper EBR is a solution of $H_2SO_4$ (sulfuric acid) and $H_2O_2$ (hydrogen peroxide) in water. A preferred composition of the etchant is 1.4% to 10% $H_2SO_4$ by weight (preferably 2.5% to 7.5%) and 3.5% to 7.5% $H_2O_2$ by weight (preferably 3.5% to 6.5%).

It has been found that this relatively dilute mixture of hydrogen peroxide and sulfuric acid provides an etchant with an excellent rate of copper etch. In storage, the etchant maintains a sufficiently high etch rate for over a month. Alternatively, dilute (about 2–15% by weight) acid and peroxide can be stored in separate containers and mixed in a small tank for short-term storage prior to use, or mixed on-line just prior to their use. There is an exothermic release with the mixing, but it is small at these dilute concentrations. Either of these mixing approaches is effective and preferred, since sulfuric acid is a stable compound, and low concentration hydrogen peroxide (e.g., <10%) can be safely stored for over a year with stabilizers well-known in the art. A system and method for in-line mixing and delivery of this preferred etchant is described in below. Processing of the etchant after use is not difficult and is generally compatible with waste-treatment methods that are used to process copper electroplating solutions as well.

While sulfuric acid and hydrogen peroxide work well in these capacities, the invention is not so limited. Note that if an oxidant other than hydrogen peroxide is used, some of the precautions described herein against generating oxygen bubbles can be eliminated. Also, if an acid other than sulfuric acid is used, some of the precautions against the exothermic mixing reaction can be eliminated. Two possible, but less preferred, etchant includes $S_2O_8^{-2}$ (peroxydisulfate) and concentrated $HNO_3$ (~30% in water), which is described in U.S. Pat. No. 5,486,234, which is herein incorporated by reference in its entirety.

Generally, the liquid etchant should have physical properties compatible with the etching system. The viscosity and density should allow easy delivery onto the semiconductor wafer in a desired flow regime (e.g., a viscous flow regime). It has been found that the fluid properties of the most effective etchants are very similar to those of water (e.g., surface tension, contact angle, and viscosity). The above-described dilute sulfuric acid/hydrogen peroxide etchant meets this requirement.

Figure 5A:
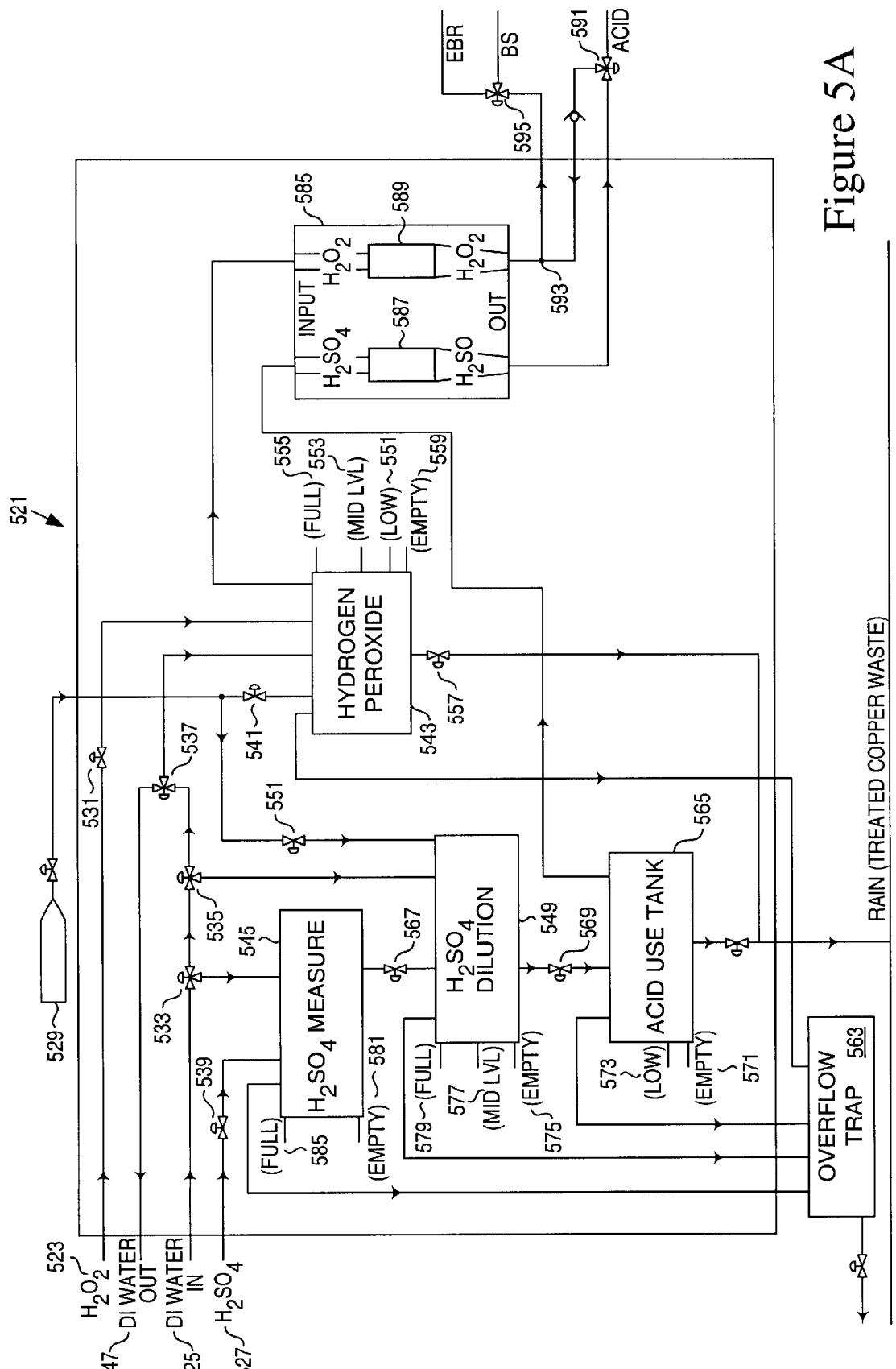
FIG. 5A is a block diagram illustrating various elements of a chemical dilution module in accordance with one embodiment of this invention.

FIG. 5A depicts one example of a suitable chemical dilution module 521 for use with this invention. Dilution module 521 should provide liquid acid and liquid etchant to the post electrofill module at appropriate concentrations and flow rates. It should also provide these liquid reagents free of gas bubbles and substantial concentrations of dissolved gas.

In the depicted example, inputs to the chemical dilution module 521 include a source of concentrated hydrogen peroxide 523, a source of deionized water 525, and a source of concentrated sulfuric acid 527. Preferably each of these three sources are from central sources available in the integrated circuit fabrication facility. Typically, concentrated hydrogen peroxide, as provided via source 523, comes in one of two grades, corresponding to approximately 30% and approximately 60% by weight. Typically the concentrated sulfuric acid is provided at a concentration of approximately 96%. The remaining input to module 521 is a nitrogen source 529. This may be the same source as used in the post electrofill module 520 (source 530). It is used to purge dissolved oxygen gas from hydrogen peroxide in module 521. It may also be used to facilitate mixing of the water and hydrogen peroxide, and water and sulfuric acid. Inert gases other than nitrogen (e.g., argon or helium) may be used in place of nitrogen.

The various input streams are controlled by separate valves within module 521. For example, the concentrated hydrogen peroxide stream is controlled by a valve 531 which controls delivery of the concentrated hydrogen peroxide to a hydrogen peroxide reservoir 543. The stream of concentrated sulfuric acid is controlled by a valve 539 which allows delivery of the concentrated acid to a sulfuric acid measure tank 545. The nitrogen from source 529 is controlled by a valve 541 which allows introduction of the nitrogen into peroxide reservoir 543. Deionized water from source 525 is provided to three separate tanks under the control of valve 533, 535, and 537. Deionized water that is not delivered to one of these three tanks exits from module 521 via a deionized water outlet 547. Valve 533 controls delivery of deionized water to the sulfuric acid measure tank 545. Valve 535 controls delivery of deionized water to a sulfuric acid dilution tank 549. Valve 537 controls delivery of the deionized water to peroxide reservoir 543. Note that a valve 551 controls delivery of the gaseous nitrogen to sulfuric acid dilution tank 549.

Considering now hydrogen peroxide reservoir 543, this tank provides a ready supply of appropriately diluted hydrogen peroxide ready for mixture with appropriately diluted sulfuric acid to create the liquid etchant for the post electrofill module. Concentrated hydrogen peroxide from source 523 and deionized water from source 525 are mixed within reservoir 543 to provide peroxide at the appropriate concentration. Preferably, the hydrogen peroxide is diluted to a concentration of approximately 15% in reservoir 543. A steady stream of nitrogen from source 529 bubbles through the diluted hydrogen peroxide in tank 543. This serves to purge dissolved oxygen from the diluted hydrogen peroxide. Such dissolved oxygen could create gas bubbles in the etchant delivered to module 520. As mentioned, such bubbles can have various deleterious effects on the etching process.

To facilitate peroxide dilution, tank 543 includes a low level sensor 551, a mid-level sensor 553, and a full sensor 555. When peroxide in tank 543 drops to the level of sensor 551, module 521 begins delivering concentrated peroxide from source 523. When the concentrated peroxide reaches the level of sensor 553, the module stops delivering concentrated peroxide. It then delivers deionized water from source 525 until the total level within reservoir 543 reaches the height of sensor 555. At this point, reservoir 543 is full and no further liquid is delivered.

Peroxide reservoir 543 is outfitted with a drain valve 557, which allows hydrogen peroxide to be drained from the module 521 when necessary. Further, reservoir 543 includes an empty level sensor 559. This may be used to stop the process in the event that tank filling did not occur as required. Still further, reservoir 543 is outfitted with an overfill line 561 which drains to an overflow trap 563 for module 521.

Sulfuric acid concentration is controlled via three separate tanks: the measure tank 545, the dilution tank 549, and an acid use tank 565. Sulfuric acid stored in measure tank 545 is at the same concentration as the acid from source 527. It is provided to dilution tank 549 via a valve 567 diluted acid from dilution tank 549 is provided to acid use tank 565 via a valve 569. Acid from use tank 565 is delivered directly to a post electrofill module (as source 546, for example) or mixed with hydrogen peroxide from reservoir 543 as etchant (via sources 252 and 258, for example). Acid use tank 565 includes an empty sensor 571 and a low sensor 573. Acid dilution tank 549 includes an empty level sensor 575, a mid-level sensor 577, and a full sensor 579. Finally, concentrated acid measure tank 545 includes an empty level sensor 581 and a full level sensor 583. The functions of each of these level sensors will be described below with reference to FIG. 5B. Note that each of measure tank 545, dilution tank 549, and use tank 565 is outfitted with an overflow line which drains to overflow trap 563.

Both the acid use tank 565 and the hydrogen peroxide reservoir 543 contain a line to a dual syringe pump 585. This pump includes one syringe 587 for delivering sulfuric acid and a second syringe 589 for delivering hydrogen peroxide. Syringe pump 585 controls delivery of metered amounts of sulfuric acid and liquid etchant to a post electrofill module. While the invention is not limited to the use of a syringe pump, such pumps have certain advantages. They allow precise control of the correct amount of liquid to the post electrofill module. Further, they allow a backstroke which serves to pull back any undelivered liquid from the various nozzles within the post electrofill module. This prevents dripping which might have deleterious effects on the etching and cleaning processes. In addition, syringe pumps have the advantage that they are self-priming. Thus, they are ready to deliver fluid immediately.

Because the sulfuric acid is delivered to the post-electrofill module in two forms (undiluted and mixed with peroxide to form etchant), the acid syringe 587 delivers sulfuric acid to a three-way valve 591. One line from valve 591 directly exits the chemical dilution module 521 and is made available to the post electrofill module. Another line from valve 591 directs the sulfuric acid back to a mixing T joint 593. It is here that hydrogen peroxide from syringe 589 mixes with the sulfuric acid to form the liquid etchant. From T 593, liquid etchant travels to a three-way valve 595. One line from valve 595 delivers etchant to the top side of the wafer for edge bevel removal. The other outlet line from valve 595 delivers etchant to the backside etch nozzle of the post electrofill module.

By mixing the etchant components at in-line T 593, the etchant mixing occurs immediately before use. This has the benefit of providing a sub-saturated solution of gaseous oxygen in the liquid etchant. Note that hydrogen peroxide continually decomposes to liberate molecular oxygen. Eventually, such oxygen forms gas bubbles within the liquid. Bubbling nitrogen through the peroxide reservoir 543 helps remove some of this oxygen. Diluting the hydrogen peroxide with the sulfuric acid at T 593 immediately before delivery, further dilutes the concentration of molecular oxygen within the liquid etchant and reduces the likelihood that oxygen bubbles will appear in the etchant delivered to the post-electrofill module.

While only a single syringe pump is shown, a preferred embodiment employs three separate syringe pumps, one for each of three separate post electrofill modules. Note that in FIG. 1C, the system includes three separate electrofill modules and three separate post electrofill modules, all supplied by a single chemical dilution module. In the schematic illustration of chemical dilution module 521, the peroxide reservoir and the sulfuric acid use tank may each include one, two or three separate lines to syringe pumps that supply one, two or three separate post electrofill modules.

The reagent concentrations in the various tanks can be varied as appropriate. In one embodiment, the concentration of dilute sulfuric acid in the acid dilution and acid use tanks is between about 2.5 and 15% by weight, more preferably between about 5 and 10% by weight, and most preferably between about 6 and 8% by weight. Further, the concentration of hydrogen peroxide in the hydrogen peroxide reservoir is between about 5 and 30% by weight, more preferably between about 10 and 20% by weight, and most preferably between about 12 and 18% by weight.

Figure 5B:
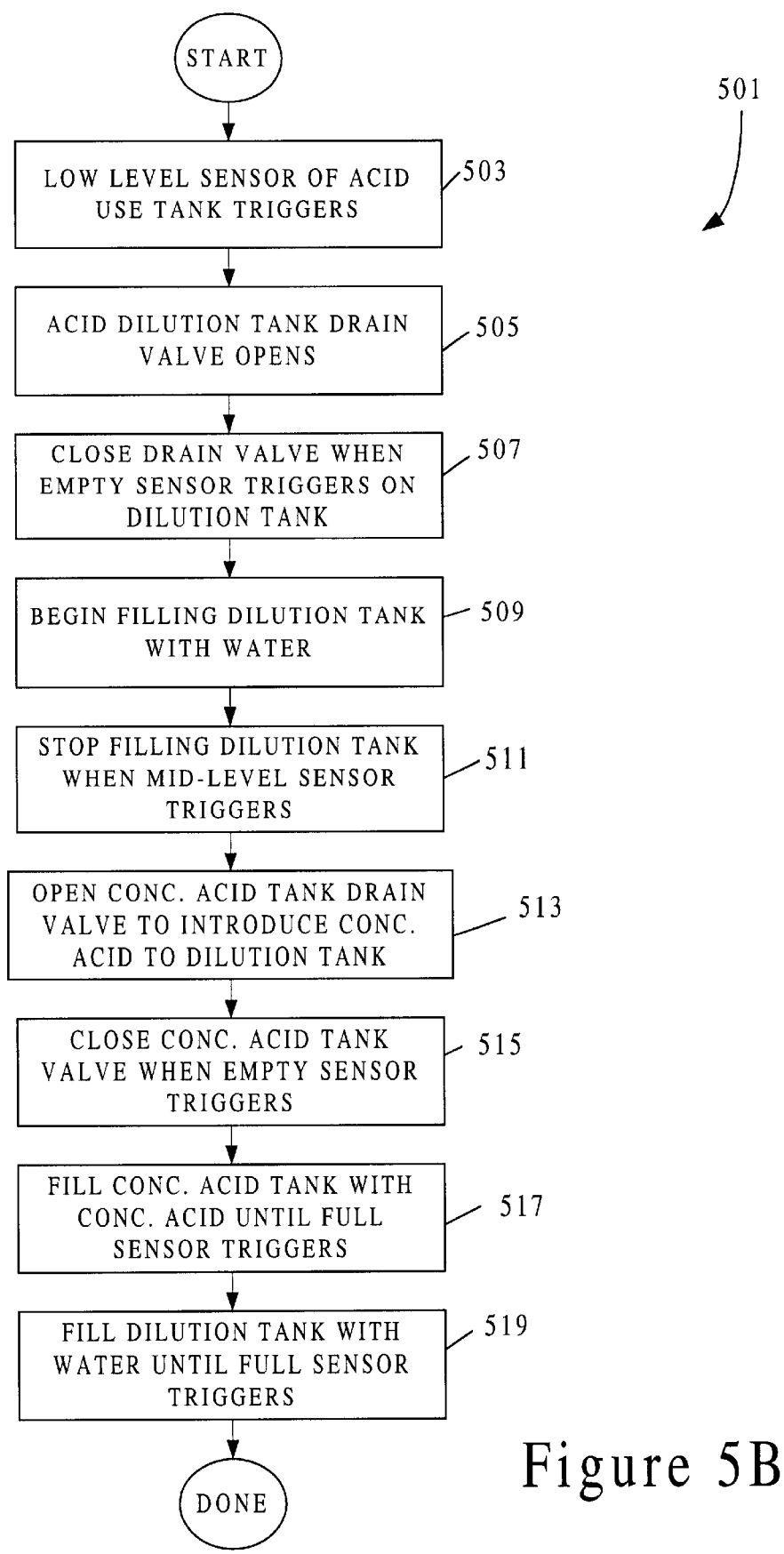
FIG. 5B is a process flow diagram depicting a sequence of operations employed to produce diluted acid for use in the post-electrofill module.

FIG. 5B is a process flow diagram depicting one suitable process 501 for preparing diluted sulfuric acid that may be employed in an etchant for a post electrofill module. Process 501 will be described with reference to some components of chemical dilution module 521 depicted in FIG. 5A. The inventive process is not limited to dilution modules necessarily having the same or similar components or arrangements of components.

Process 501 begins at 503 with low-level sensor 573 of acid use tank 565 indicating that the level of sulfuric acid in that tank has reached the level triggered by sensor 573. At this point, the module begins automatically filling use tank 565. Specifically, at 505, the module triggers opening of drain valve 569 to allow diluted sulfuric acid to flow from dilution tank 549 into use tank 565. Acid continues to flow into use tank 565 until the empty sensor 575 of dilution tank 549 triggers. This indicates that the level of acid in dilution tank 549 has dropped down to the level triggered by empty sensor 575. When this occurs, the module closes drain valve 569. See 507.

Next, the sulfuric acid in dilution tank 549 must be replenished. The module accomplishes this by first opening valve 535 to allow deionized water to flow into dilution tank 549. See 509. Deionized water continues to flow into tank 549 until mid-level sensor 577 indicates that its level has been reached. See 511. In a preferred embodiment, about 1 liter of deionized water is delivered to tank 549. At this point, valve 535 closes access to tank 549.

Next, at 513, the module opens drain valve 567 allowing the concentrated sulfuric acid from measure tank 545 to drain into dilution tank 549. In a preferred embodiment, about 75 milliliters of concentrated sulfuric acid is delivered. Regardless of the absolute quantities, concentrated sulfuric acid drains from tank 545 until the empty level sensor 581 triggers. At this point, the module closes drain valve 567. See 515.

Thereafter, the acid measure tank 545 is topped to the full level sensor 585 with concentrated sulfuric acid from source 527. See 517. Simultaneously, acid dilution tank 549 is topped with deionized water until its full level sensor 579 is reached. This facilitates mixing. In one embodiment, about an additional 1 liter of water is added. At this point the process is complete and remains quiescent until the diluted acid in use tank 565 needs to be replenished again.

This method has various advantages. All mixing is conducted in the dilution module 549 which is separate from use tank 565 and measure tank 545. With this arrangement, diluted acid is available at all times via use tank 565. The acid has been premixed and allowed to cool in separate dilution tank 549. Because the dilution process is highly exothermic, the freshly mixed acid is allowed to cool in dilution tank 549 prior to delivery to use tank 565. Note that the concentrated acid is added to a large volume of water in dilution tank 549 in order to control the highly exothermic reaction. Note also that nitrogen is bubbled through sulfuric acid in dilution tank 549. This facilitates mixing of the concentrated acid and the dionized water. It also deoxygenates the diluted sulfuric acid. This reduces the likelihood of oxygen bubbles forming in the liquid etchant.

Figure 5C:
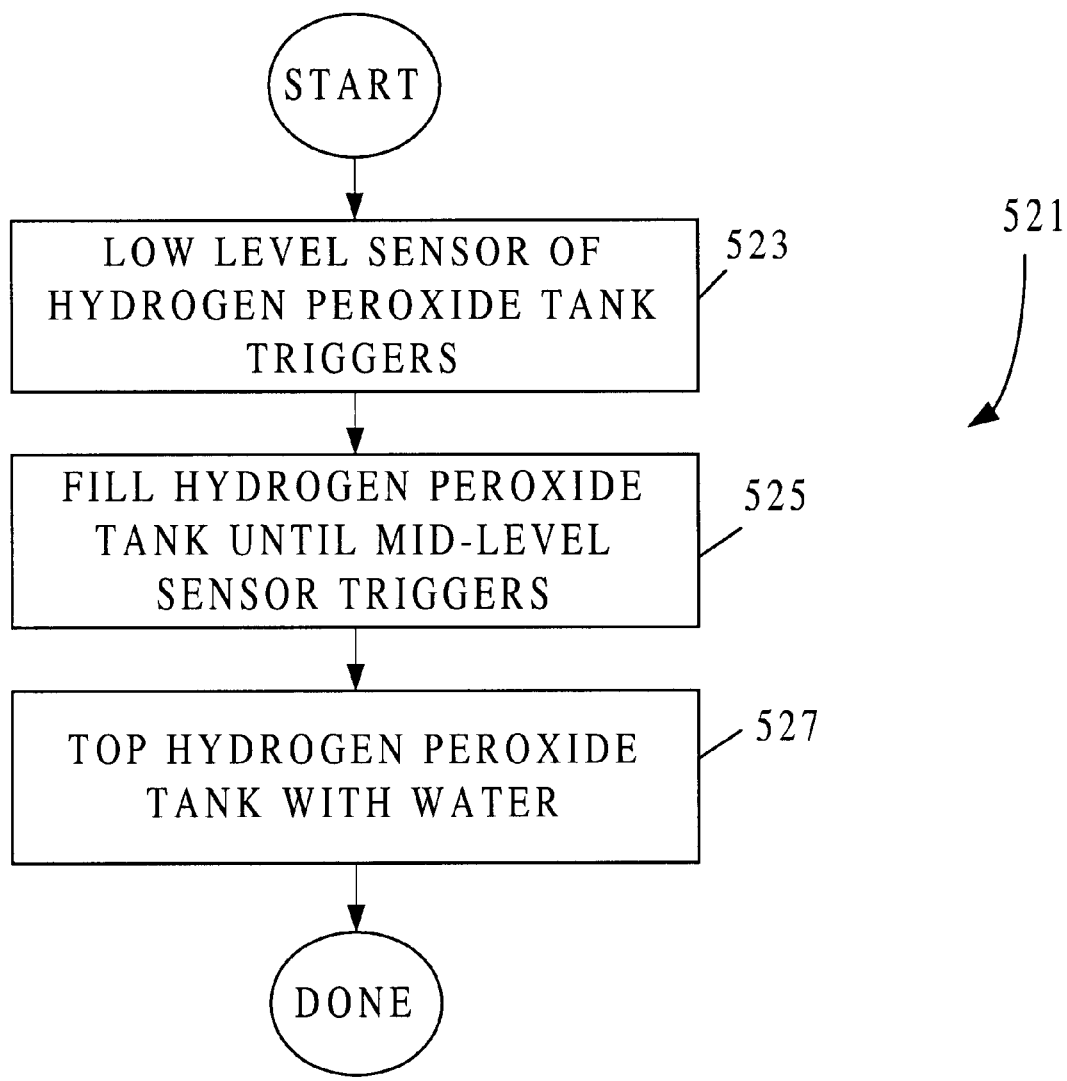
FIG. 5C is a process flow diagram depicting a sequence of operations employed to produce diluted hydrogen peroxide for use in the post-electrofill module.

FIG. 5C presents a process 521 for diluting hydrogen peroxide in accordance with one embodiment of this invention. Other suitable processes may be employed. Note that this discussion makes reference to chemical dilution module 521 and its associated components. The hydrogen peroxide dilution processes of this invention are not limited to module 521, the components contained therein, or the arrangement of components illustrated.

Process 521 begins at 523, with module 521 detecting a signal from low level sensor 551 of hydrogen peroxide reservoir 543. At this point, the module opens valve 531 to allow concentrated hydrogen peroxide to flow into reservoir 543. This process continues until the module receives a signal from mid-level sensor 553 of reservoir 543. At this point, the flow of concentrated hydrogen peroxide to the reservoir is stopped by closing valve 531. See 525. At this point, the module opens valve 537 to allow deionized water to flow into reservoir 543 until the full level sensor 553 signals that reservoir 543 is full. See 527. The process is then complete.

While this invention has been described in terms of a few preferred embodiments, it should not be limited to the specifics presented above. Many variations on the above-described preferred embodiments, may be employed. Note, for example, that other metal deposition processes (e.g., non-copper and/or non-PVD processes) frequently present the same problems as outlined above for the copper seed layer PVD process. In each case, unwanted metal must be removed after the deposition process. Further, unwanted metal may have to be removed from locations other than the edge of the semiconductor wafer. The present invention may be employed to etch unwanted metal in these cases. Therefore, the invention should be broadly interpreted with reference to the following claims.

What is claimed is:

1. A chemical dilution module for providing liquid etchant to an etching system that etches unwanted copper from a semiconductor wafer, the chemical dilution module comprising:
   an acid dilution tank for mixing concentrated acid and water to a specified concentration;
   a hydrogen peroxide dilution tank for diluting concentrated hydrogen peroxide to a specified concentration; and
   an in-line mixing area for combining hydrogen peroxide from the hydrogen peroxide dilution tank with diluted acid, whereby mixing occurs principally when hydrogen peroxide and acid are delivered to the etching system.

2. The chemical dilution module of claim 1, further comprising a line directly connecting the in-line mixing area to the etching system.

3. The chemical dilution module of claim 1, further comprising an acid measure tank for measuring a volume of concentrated sulfuric acid and delivering said volume of concentrated sulfuric acid to the acid dilution tank.

4. The chemical dilution module of claim 3, further comprising a sulfuric acid use tank connected between the acid dilution tank and the in-line mixing area, wherein the sulfuric acid use tank holds sulfuric acid that has been diluted in the acid dilution tank and makes the diluted sulfuric acid available for in-line mixing.

5. The chemical dilution module of claim 4, wherein the sulfuric acid use tank includes a level sensor which triggers filling of the use tank with diluted sulfuric acid from the acid dilution tank.

6. The chemical dilution module of claim 1, wherein the acid dilution tank includes a level sensor which triggers delivery of first water and then concentrated acid to the acid dilution tank.

7. The chemical dilution module of claim 1, further comprising at least one metering pump which provides dilute acid and dilute hydrogen peroxide to the in-line mixing region.

8. The chemical dilution module of claim 7, wherein the at least one metering pump comprises at least one syringe pump.

9. The chemical dilution module of claim 1, wherein the concentrated acid is concentrated sulfuric acid provided from a source of concentrated sulfuric acid in an integrated circuit fabrication facility.

10. The chemical dilution module of claim 1, wherein the hydrogen peroxide dilution tank comprises a purge gas bubbler which purges dissolved oxygen from the hydrogen peroxide in the hydrogen peroxide dilution tank.

11. The chemical dilution module of claim 1, wherein the hydrogen peroxide dilution tank includes a level sensor which triggers delivery of water and concentrated hydrogen peroxide to the hydrogen peroxide dilution tank.

12. The chemical dilution module of claim 1, wherein the acid is sulfuric acid and the concentration of sulfuric acid is between about 5 and 15% by weight in the acid dilution tank and the concentration of hydrogen peroxide is between about 10 and 30% by weight in the hydrogen peroxide dilution tank.

13. A method of providing liquid etchant to an etching system that etches unwanted copper from a semiconductor wafer, the method comprising:
   diluting concentrated acid in an acid dilution tank;
   diluting concentrated hydrogen peroxide in a hydrogen peroxide dilution tank; and
   in a single line to the etching system, mixing dilute acid and dilute hydrogen peroxide from the dilution tanks, whereby mixing occurs principally when hydrogen peroxide and acid are delivered to the etching system.

14. The method of claim 13, further comprising delivering mixed hydrogen peroxide and acid as the liquid etchant to the etching system.

15. The method of claim 13, further comprising delivering the concentrated sulfuric acid from an acid measure tank to the acid dilution tank.

16. The method of claim 13, further comprising storing diluted sulfuric acid from the acid dilution tank in a sulfuric acid use tank, which sulfuric use tank makes dilute sulfuric acid available for the mixing with dilute hydrogen peroxide.

17. The method of claim 16, further comprising:
   detecting that the level of dilute sulfuric acid in the use tank has fallen below a preset level; and
   filling the use tank with diluted sulfuric acid from the acid dilution tank.

18. The method of claim 13, further comprising:
   detecting that the level of dilute sulfuric acid in the acid dilution tank has fallen below a preset level; and
   delivering first water and then concentrated sulfuric acid to the acid dilution tank.

19. The method of claim 13, wherein the dilute acid and the dilute hydrogen peroxide are delivered for mixing by the action of at least one metering pump.

20. The method of claim 19, further comprising performing a backstroke with the at least one metering pump to prevent dripping of the liquid etchant in the etching system after delivery of the liquid etchant to the etching system.

21. The method of claim 13, further comprising providing concentrated sulfuric acid to the acid dilution tank from a source of concentrated sulfuric acid in an integrated circuit fabrication facility.

22. The method of claim 13, further comprising bubbling a purge gas through the dilute hydrogen peroxide in the dilution tank to thereby purge dissolved oxygen gas from the dilute hydrogen peroxide.

23. The method of claim 13, further comprising:
   detecting that the level of dilute hydrogen peroxide in the dilution tank has fallen below a preset level; and
   delivering water and concentrated hydrogen peroxide to the hydrogen peroxide dilution tank.

24. The method of claim 13, wherein the acid is sulfuric acid and the concentration of sulfuric acid is between about 5 and 15% by weight in the sulfuric acid dilution tank and the concentration of hydrogen peroxide is between about 10 and 30% by weight in the hydrogen peroxide dilution tank.

* * * * *

UNITED STATES PATENT AND TRADEMARK OFFICE
CERTIFICATE OF CORRECTION

PATENT NO. : 6,333,275 B1  Page 1 of 1
DATED : December 25, 2001
INVENTOR(S) : Mayer et al.

It is certified that error appears in the above-identified patent and that said Letters Patent is hereby corrected as shown below:

<u>Title page,</u>
Item [75], please replace Inventor: "Jinbin Feng" with -- Jingbin Feng --.

Signed and Sealed this

Twenty-first Day of May, 2002

Attest:

*Attesting Officer*

JAMES E. ROGAN
*Director of the United States Patent and Trademark Office*